United States Patent

Yoon et al.

(10) Patent No.: US 8,008,155 B2
(45) Date of Patent: Aug. 30, 2011

(54) GATE ELECTRODE STRUCTURE

(75) Inventors: Jaeman Yoon, Seoul (KR); Yungi Kim, Yongin (KR); Hyeoungwon Seo, Yongin (KR); Kangyoon Lee, Seongnam (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 451 days.

(21) Appl. No.: 11/808,462

(22) Filed: Jun. 11, 2007

(65) Prior Publication Data

US 2008/0017913 A1 Jan. 24, 2008

(30) Foreign Application Priority Data

Jul. 21, 2006 (KR) .................... 10-2006-0068423

(51) Int. Cl.
*H01L 21/336* (2006.01)

(52) U.S. Cl. .................. 438/287; 257/288; 257/324

(58) Field of Classification Search .............. 257/288, 257/324; 438/287
See application file for complete search history.

(56) References Cited

U.S. PATENT DOCUMENTS

| | | | |
|---|---|---|---|
| 4,833,099 A * | 5/1989 | Woo .............. | 438/230 |
| 5,834,353 A | 11/1998 | Wu | |
| 6,486,030 B2 | 11/2002 | Gonzalez et al. | |
| 6,613,657 B1 * | 9/2003 | Ngo et al. ........ | 438/588 |
| 6,858,524 B2 | 2/2005 | Haukka et al. | |
| 2002/0145161 A1 * | 10/2002 | Miura et al. ..... | 257/314 |
| 2003/0235083 A1 * | 12/2003 | Swift et al. ..... | 365/185.29 |
| 2005/0145896 A1 * | 7/2005 | Song et al. ..... | 257/288 |
| 2005/0205969 A1 * | 9/2005 | Ono et al. ........ | 257/645 |
| 2006/0118858 A1 * | 6/2006 | Jeon et al. ....... | 257/321 |
| 2007/0296026 A1 * | 12/2007 | Jeon et al. ....... | 257/324 |
| 2007/0298568 A1 * | 12/2007 | Mokhlesi ........ | 438/257 |

FOREIGN PATENT DOCUMENTS

| | | |
|---|---|---|
| KR | 10-2001-0056787 | 7/2001 |
| KR | 10-2002-0056261 | 7/2002 |

OTHER PUBLICATIONS

Korean Office Action dated Aug. 29, 2007 for corresponding Korean Application No. 10-2006-0068423.

* cited by examiner

*Primary Examiner* — Thao X Le
*Assistant Examiner* — Geoffrey Ida
(74) *Attorney, Agent, or Firm* — Harness, Dickey & Pierce, P.L.C.

(57) ABSTRACT

An electrode structure, e.g., a gate electrode for a transistor, includes: a volume of semiconductor material; a gate oxide on the semiconductor volume; a barrier layer, including silicon nitride, on the gate oxide layer; an adhesion layer on the barrier layer; and a metallic layer on the adhesion layer.

9 Claims, 3 Drawing Sheets

GATE ELECTRODE STRUCTURE

PRIORITY STATEMENT

The present patent application claims priority under 35 U.S.C. §119 upon Korean Patent Application No. 2006-0068423, filed on Jul. 21, 2006, in the Korean Patent Office, the entire contents of which is incorporated herein in its entirety by reference.

BACKGROUND

MOS (metal oxide semiconductor) types of transistors have progressively become smaller and smaller, and accordingly so have the gate electrode structures of the MOS-type transistors. Such reductions in size have been achieved by, among other things, evolutionary changes in gate electrode structures. Occasionally, a first change that was made to reduce the gate electrode size has caused a subsequent second change that compensated for an unintended consequence of the first change.

Consider an example of such first and second changes in the context of a gate electrode structure having a substrate, on it a gate insulating layer, and on it a polysilicon layer. As a first change, a metal layer was used to replace the polysilicon layer in the gate electrode structure. During subsequent heat treatments of the revised gate electrode structure, the metal layer undesirably reacted with the gate insulating layer. As a second change that compensated for the first, a barrier layer was interposed between the gate oxide layer and the metal layer.

SUMMARY

An embodiment of the present invention provides an electrode structure, e.g., a gate electrode for a transistor, that includes: a volume of semiconductor material; a gate oxide on the semiconductor volume; a barrier layer, including silicon nitride, on the gate oxide layer; an adhesion layer on the barrier layer; and a metallic layer on the adhesion layer.

An embodiment of the present invention provides a transistor structure for a semiconductor device, the structure comprising: a semiconductor volume; a gate electrode structure, on the semiconductor volume, such as described above; source and drain electrodes disposed on opposite sides of the gate electrode; and impurity doped source and drain regions in the semiconductor volume between the source and drain electrodes, respectively.

An embodiment of the present invention provides a method of forming an electrode structure, e.g., a gate electrode for a transistor. Such a method can comprise: providing a semiconductor volume; forming layers of a laminated structure by doing at least the following, forming a gate oxide layer on the semiconductor volume, forming a barrier layer, on the gate oxide layer, that includes silicon nitride, forming an adhesion layer on the barrier layer, and forming a metal layer on the adhesion layer; patterning a mask onto the metal layer of the laminated structure; and selectively removing portions of the layers of the laminated structure not underlying the mask.

An embodiment of the present invention provides a method of forming a transistor. Such a method can comprise: providing a substrate; providing, as a gate electrode structure on the substrate, an electrode structure according to the method described above; forming sidewall spacers against sides of the gate electrode structure and on the substrate; and forming source/drain regions in the substrate using the sidewall spacers and the gate electrode structure as a mask.

Additional features and advantages of the present invention will be more fully apparent from the following detailed description of example embodiments, the accompanying drawings and the associated claims.

Figure 1:
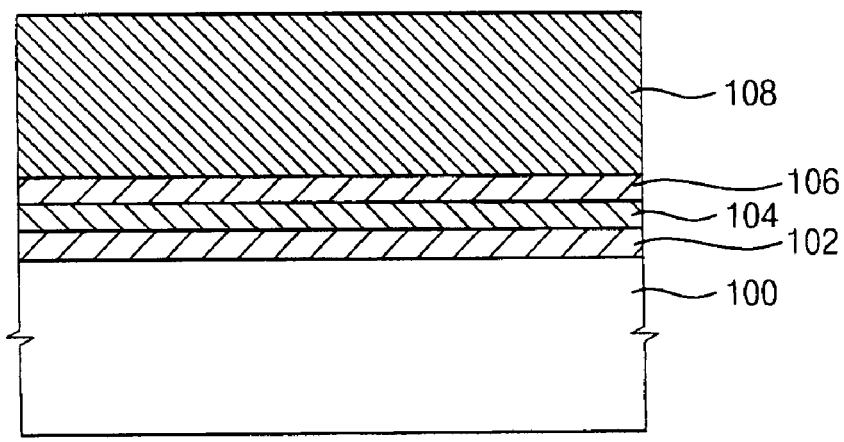
FIGS. 1-4 are cross-sectional views of various intermediary stages in a method (according to an example embodiment of the present invention) for manufacturing a gate electrode structure for a semiconductor device.

The accompanying drawings are intended to depict example embodiments of the present invention and should not be interpreted to limit the scope thereof. The accompanying drawings are not to be considered as drawn to scale unless explicitly noted.

DETAILED DESCRIPTION OF EXAMPLE EMBODIMENTS

It will be understood that if an element or layer is referred to as being "on," "against," "connected to" or "coupled to" another element or layer, then it can be directly on, against connected or coupled to the other element or layer, or intervening elements or layers may be present. In contrast, if an element is referred to as being "directly on", "directly connected to" or "directly coupled to" another element or layer, then there are no intervening elements or layers present. Like numbers refer to like elements throughout. As used herein, the term "and/or" includes any and all combinations of one or more of the associated listed items.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In developing one or more embodiments of the present invention, the inventor recognized (without being bound by theory) at least the following: the layers in a gate structure (formed as a stack of layers) in an MOS-type transistor typically have different coefficients of thermal expansion; in response to changes in temperature, layers in the gate electrode expand/contract differently; semiconductor devices generally endure substantial heat cycling (e.g., there being a significant difference between a typical ambient temperature after a power-off cool-down and normal operating temperature); with each heat cycle, differences in thermal expansion of the layers in the gate electrode cause mechanical stresses upon the adhesions between various contiguous layers of the gate; and such repeated mechanical stresses can lead eventually to one or more layers peeling/lifting. At least one embodiment of the present invention provides a gate electrode structure for an MOS-type transistor that is less susceptible to such thermal-stress-induced peeling. At least one embodiment of the present invention provides such a gate electrode structure that is less susceptible to such stresses due to inclusion of an adhesion layer interposed between a barrier layer and a metallic layer.

FIGS. 1-4 are cross-sectional views of various intermediary stages in a method (according to an example embodiment of the present invention) for manufacturing a gate electrode structure for a semiconductor device.

In FIG. 1, an intermediate structure is depicted, which can result from the following. A substrate 100 is provided. A gate oxide layer 102 is formed on substrate 100. A barrier layer 104 is formed on gate oxide layer 102. A first adhesion layer 106 is formed on barrier layer 104. And a metal layer 108 is formed on adhesion layer 106.

Material for substrate 100 can be, e.g., monocrystalline silicon. In substrate 100, plural active regions (not depicted) can be defined by forming isolation regions (not depicted) between the active regions. Material for gate oxide layer 102 can be, e.g., a silicon oxide such as $SiO_2$ or $SiO_xN_y$, etc. Material for barrier film 104 can be, e.g., silicon nitride, $Si_3N_4$, etc. Material for first adhesion layer 106 can be, e.g., a silicon oxide such as a silicon oxide such as $SiO_2$ or $SiO_xN_y$, etc. Material for metallic layer 108 can be TiN, Ti, TaN, Ta, etc.

Barrier layer 104 can have a thickness, t, e.g., of about 5 Å≦t≦about 50 Å. First adhesive layer 106 can have a thickness, t, e.g., of about 5 Å≦t≦about 30 Å.

Gate oxide layer 102 can be formed, e.g., by thermal oxidation of substrate 100. Barrier layer 104 can be formed, e.g., by chemical vapor deposition ("CVD") using reaction gases including, e.g., silicon source gas and nitrogen. First adhesion layer 106 can be formed, e.g., by CVD using reaction gases including, e.g., silicon source gas and nitrogen.

Alternatively, first adhesion layer 106 can be formed, e.g., by a non-thermal process (such as oxygen plasma treatment) that oxidizes barrier layer 104. In this alternative, care should be exercised not to consume too much of barrier layer 104 during the production of first adhesion layer 106.

Figure 2:
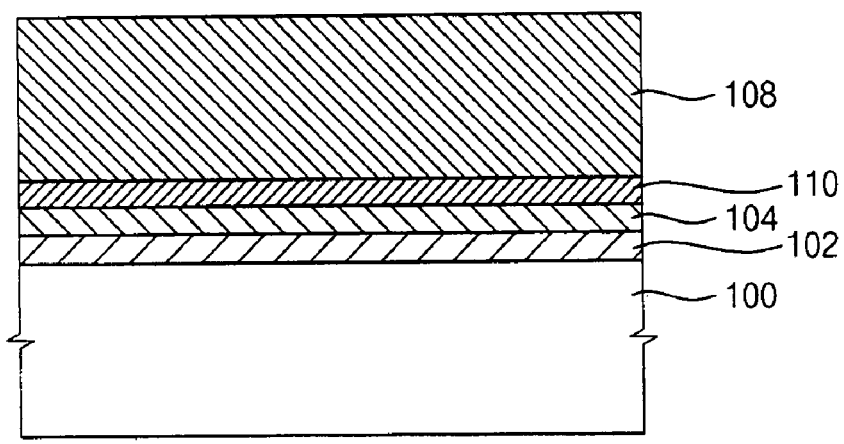

In FIG. 2, an intermediate structure is depicted, which can result from the following. A heat treatment can be performed upon the intermediate structure of FIG. 1, which transforms first adhesion layer 106 into a second adhesion layer 110. As contrasted with first adhesion layer 106, second adhesion layer 110 exhibits greater adhesive strength.

The heat treatment resulting in the intermediate structure of FIG. 2 can be performed at a temperature, TEMP, of about 300° C.≦TEMP≦about 800° C. Furthermore, the heat treatment can be performed in a gaseous atmosphere that includes nitrogen, e.g., $N_2$, $NH_3$, etc. More particularly (and without being bound by theory), the transformation of first adhesion layer 106 occurs at least due to a reaction between first adhesion layer 106 and metallic layer 108. Accordingly, material for second adhesion layer 110 includes, e.g., silicon, silicon oxide and metal oxide.

Without being bound by theory: due to second adhesion layer 110 having been formed at least in part due to a reaction between first adhesion layer 106 and metallic layer 108, the interface between metallic layer 108 and second adhesion layer 110 is more dense; and second adhesion layer 110 exhibits greater adhesion to metallic layer 108 than if second adhesion layer 110 had been formed only via a deposition process. In other words, the heat treatment changes the chemistry of the interface between metallic layer 108 and second adhesion layer 110 (formerly first adhesion layer 106).

The coefficient of thermal expansion, β, of second adhesion layer 110 is between the coefficients of thermal expansion for barrier layer 104 and metallic layer 108. In other words, either $$\beta_{104} < \beta_{110} < \beta_{108}$$

OR $$\beta_{104} > \beta_{110} > \beta_{108},$$

where β104 is the coefficient of thermal expansion for barrier layer 104, β110 is the coefficient of thermal expansion for second adhesion layer 110, and β108 is the coefficient of thermal expansion for metallic layer 110. As such, second adhesion layer 110 reduces the thermally-induced mechanical stresses upon each of barrier layer 104 and metallic layer 108 vis-à-vis a circumstance in which second adhesion layer 110 was not interposed between the two. By reducing such stresses, lifting/peeling between barrier layer 104 and metallic layer 108 can be reduced (if not prevented).

Figure 3:
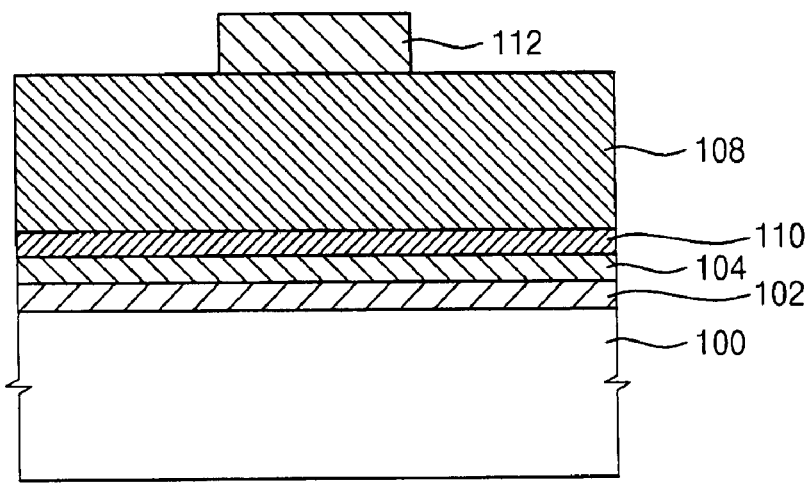

In FIG. 3, an intermediate structure is depicted, which can result from the following. A layer (not depicted in its entirety) of masking material is formed on the intermediate structure of FIG. 2, subsequently patterned, and portions thereof are selectively removed. As a result, hard mask 112 remains on metallic layer 108. Material for the masking layer, i.e., for hard mask 112, can be, e.g., silicon nitride, $Si_3N_4$, etc. The layer of masking material can be formed, e.g., by chemical vapor deposition ("CVD") using reaction gases including, e.g., silicon source gas and nitrogen.

Figure 4:
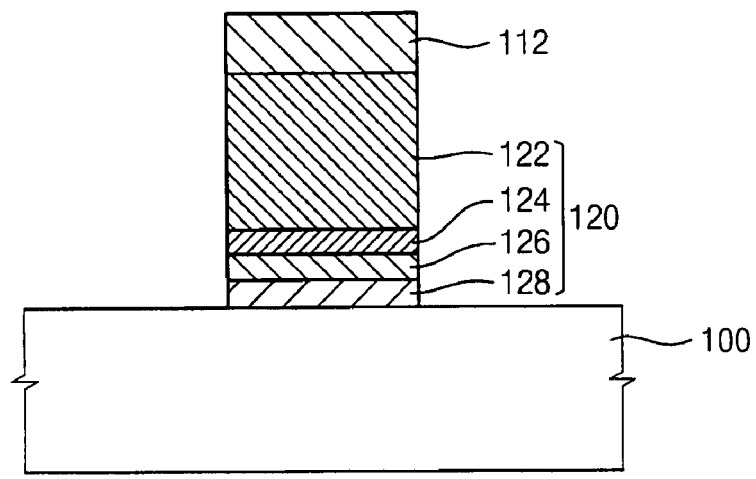

In FIG. 4, an intermediate structure is depicted, which can result from the following. Portions of the intermediate structure of FIG. 3 are selectively removed by, e.g., anisotropic etching using hard mask 112 as its name implies, i.e., as a mask. In FIG. 4, portions of substrate 100 are exposed.

Remaining underneath hard mask 112 in FIG. 4 is a gate electrode structure 120, which includes: the remainder of gate oxide layer 102, i.e., a gate oxide layer 128 (located on substrate 100); the remainder of barrier layer 104, i.e., a barrier layer 126 (formed on gate oxide layer 128); the remainder of second adhesion layer 110, i.e., a second adhesion layer 124 (formed on barrier layer 126); and the remainder of metallic layer 108, i.e., a metallic layer 122 (formed on second adhesion layer 124). Gate electrode structure 120 can be described as a stack of layers or as a laminated structure.

Figure 5:
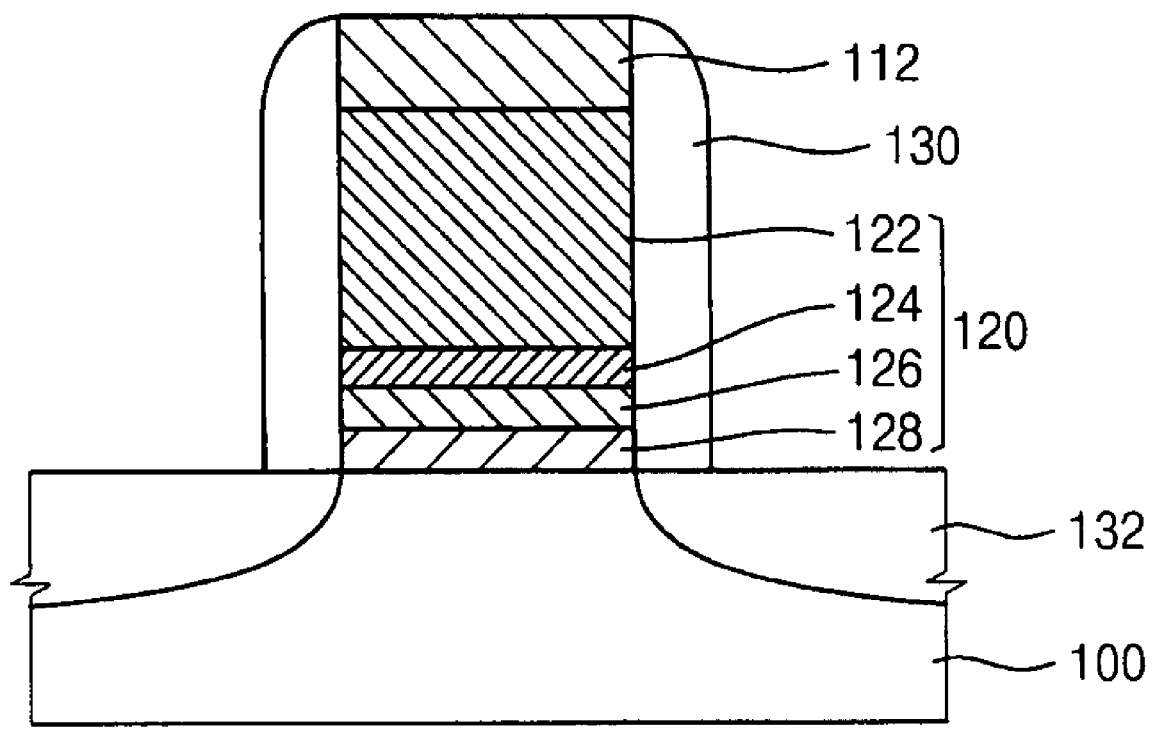
FIG. 5 is a cross-sectional view of a transistor (according to an example embodiment of the present invention) that includes, e.g., the gate electrode structure of FIG. 4.

FIG. 5 is a cross-sectional view of a transistor (according to an example embodiment of the present invention) that includes, e.g., gate electrode structure 120 of FIG. 4.

In FIG. 5, the transistor includes: substrate 100; gate electrode 120 formed on substrate 100; sidewall spacers 130 formed on the sides of gate electrode 120; and source/drain regions 132 formed in substrate 100 aside, and extending underneath, sidewall spacers 130.

The transistor of FIG. 5 can result from the following. Sidewall spacers 130 are formed on the intermediate structure of FIG. 4. Impurity ions are implanted into substrate 100 using sidewalls 130 and gate electrode 120 as a mask.

It should be understood that the foregoing has broad applicability, and thus also applies to vertical transistor types (e.g., those having cylindrical vertical channels, those having rectangular solid vertical channels, etc.), silicon nano wire transistor types, planar transistor types, etc. Accordingly, a volume in which the channel of the transistor will be induced can be located elsewhere than in substrate 100; for example, the channel-containing volume can alternatively take the shape of: a pillar disposed on a substrate; a substantially rectangular solid; a cylinder, etc.

With some embodiments of the present invention having thus been described, it will be obvious that the same may be varied in many ways. Such variations are not to be regarded as a departure from the spirit and scope of the present invention, and all such modifications are intended to be included within the scope of the present invention.

The invention claimed is:

1. A method of forming an electrode structure, the method comprising:
   providing a semiconductor substrate;
   forming layers of a laminated structure by doing at least the following,
      forming a gate oxide layer directly on the semiconductor substrate,
      forming a barrier layer, on the gate oxide layer, the barrier layer that includes silicon nitride,
      forming an adhesion layer on the barrier layer, and
      forming a metal layer on the adhesion layer;
   patterning a mask onto the metal layer of the laminated structure; and
   selectively removing portions of the layers of the laminated structure not underlying the mask,
   wherein forming layers of the laminated structure further includes:
   heat treating the laminated structure and the semiconductor substrate to transform the adhesion layer so as to include a metal oxide.

2. The method of claim 1, wherein:
   the semiconductor substrate is silicon; and
   forming layers of the laminated structure includes the following,
      oxidizing the semiconductor substrate to form the gate oxide layer so as to include at least one of $SiO_2$ and $SiO_xN_y$.

3. The method of claim 1, wherein forming layers of the laminated structure further includes:
   heat treating the laminated structure and the semiconductor substrate to change the chemistry of an interface between the adhesion layer and the metal layer.

4. The method of claim 3, wherein heat treating includes:
   subjecting the laminated structure and semiconductor substrate to at least the following,
      a temperature TEMP, where TEMP is (about 300° C.)$\leq$TEMP$\leq$(about 800° C.), and
      a gaseous atmosphere that includes at least one of $N_2$ and $NH_3$.

5. The method of claim 1, wherein forming layers of the laminated structure further includes:
   forming the adhesion layer by chemical vapor deposition (CVD).

6. The method of claim 1, wherein forming layers of the laminated structure further includes:
   forming the metal layer as including at least one of Ti, TiN, Ta and TaN.

7. The method of claim 1, wherein forming layers of the laminated structure further includes:
   forming the barrier layer to have a thickness, t, where t is (about 5 Å)$\leq$t$\leq$(about 50 Å).

8. The method of claim 1, wherein forming layers of the laminated structure further includes:
   forming the adhesion layer to have a thickness, t, where t is (about 5 Å)$\leq$t$\leq$(about 30 Å).

9. A method of forming a transistor, the method comprising:
   providing a substrate;
   providing, as a gate electrode structure on the substrate, an electrode structure according to the method of claim 1;
   forming sidewall spacers against sides of the gate electrode structure and on the substrate; and
   forming source/drain regions in the substrate using the sidewall spacers and the gate electrode structure as a mask.

* * * * *